(12) United States Patent
Oh et al.

(10) Patent No.: US 9,171,604 B2
(45) Date of Patent: Oct. 27, 2015

(54) REFRESH CONTROL CIRCUIT OF SEMICONDUCTOR APPARATUS AND REFRESH METHOD USING THE SAME

(71) Applicant: SK hynix Inc., Icheon-si, Gyeonggi-do (KR)

(72) Inventors: Sang Mook Oh, Icheon-si (KR); Tae Sik Yun, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/243,651

(22) Filed: Apr. 2, 2014

(65) Prior Publication Data

US 2015/0162064 A1   Jun. 11, 2015

(30) Foreign Application Priority Data

Dec. 9, 2013   (KR) ........................ 10-2013-0152122

(51) Int. Cl.
| | |
|---|---|
| G11C 11/406 | (2006.01) |
| G11C 8/10 | (2006.01) |
| G11C 29/04 | (2006.01) |
| G11C 8/00 | (2006.01) |
| G11C 8/18 | (2006.01) |
| G11C 8/04 | (2006.01) |
| G11C 11/4072 | (2006.01) |
| G11C 29/00 | (2006.01) |
| G11C 11/408 | (2006.01) |

(52) U.S. Cl.
CPC .......... *G11C 11/406* (2013.01); *G11C 11/4072* (2013.01); *G11C 29/783* (2013.01); *G11C 8/04* (2013.01); *G11C 8/18* (2013.01); *G11C 11/4087* (2013.01); *G11C 29/04* (2013.01); *G11C 2211/4065* (2013.01)

(58) Field of Classification Search
CPC .. G11C 11/406; G11C 11/4087; G11C 29/04; G11C 8/04; G11C 8/18
USPC .............................. 365/222, 236, 200, 230.01
See application file for complete search history.

(56) References Cited

U.S. PATENT DOCUMENTS

| | | | | |
|---|---|---|---|---|
| 6,310,803 | B1 * | 10/2001 | Hidaka | 365/200 |
| 2008/0031068 | A1 * | 2/2008 | Yoo et al. | 365/222 |
| 2010/0110810 | A1 * | 5/2010 | Kobayashi | 365/200 |

FOREIGN PATENT DOCUMENTS

| | | | |
|---|---|---|---|
| KR | 1020070002819 | A | 1/2007 |
| KR | 100833592 | B1 | 5/2008 |
| KR | 1020110076321 | A | 7/2011 |

* cited by examiner

*Primary Examiner* — Ly D Pham
(74) *Attorney, Agent, or Firm* — William Park & Associates Ltd.

(57) ABSTRACT

A refresh control circuit of a semiconductor apparatus includes a repair address processing unit configured to compare refresh addresses and repair information, activate a redundant enable signal, and convert the semiconductor apparatus into the same operation state as an initialization state of the repair information in response to activation of a repair initialization signal; a refresh counter configured to count the refresh addresses extended to a signal bit in response to activation of a redundant count enable signal; and a refresh control unit configured to activate the repair initialization signal and the redundant count enable signal when an additional refresh mode is set in response to a refresh command.

20 Claims, 5 Drawing Sheets

REFRESH CONTROL CIRCUIT OF SEMICONDUCTOR APPARATUS AND REFRESH METHOD USING THE SAME

CROSS-REFERENCES TO RELATED APPLICATION

The present application claims priority under 35 U.S.C. §119(a) to Korean application number 10-2013-0152122, filed on Dec. 9, 2013, in the Korean Intellectual Property Office, which is incorporated herein by reference in its entirety.

BACKGROUND

1. Technical Field

Various embodiments relate to a semiconductor apparatus, and more particularly, to a refresh control circuit of a semiconductor apparatus and a refresh method using the same.

2. Related Art

In a semiconductor apparatus, in particular, a semiconductor apparatus using a volatile memory, a refresh operation is essential.

In a conventional semiconductor apparatus, in order to increase a refresh operation speed, refresh is performed by simultaneously activating two word lines WL corresponding to two addresses LAXC<0> and LAXC<1> by the unit of a predetermined memory region (for example, by the unit of a mat), in response to one refresh command, as shown in FIG. 1.

The semiconductor apparatus includes a redundant word line for repairing a word line corresponding to a failed memory cell. A normal word line in which a fail has occurred may be repaired by the redundant word line.

In the case where the normal word line in which the fail has occurred is repaired by the redundant word line as shown in FIG. 1, as two word lines which are adjacent to each other; and share a sense amplifier are simultaneously activated, a refresh error is likely to be caused, in that wrong data may be written.

In order to cope with this problem, a repair range should be limited. However, in this case, repair efficiency is apt to be degraded.

SUMMARY

A repair control circuit of a semiconductor apparatus capable of improving repair efficiency, and a refresh method using the same are described herein.

In an embodiment, a refresh control circuit of a semiconductor apparatus may include: a repair address processing unit configured to compare refresh addresses and repair information, activate a redundant enable signal, and convert the semiconductor apparatus into a same operation state as an initialization state of the repair information in response to activation of a repair initialization signal; a refresh counter configured to count the refresh addresses extended to a signal bit in response to activation of a redundant count enable signal; and a refresh control unit configured to activate the repair initialization signal and the redundant count enable signal when an additional refresh mode is set in response to a refresh command.

In an embodiment, a refresh control circuit of a semiconductor apparatus may include: a refresh control unit configured to generate an additional refresh signal, a repair initialization signal and a redundant count enable signal in response to an additional refresh mode setting signal and a refresh signal; a repair address processing unit configured to compare refresh addresses and repair information, activate a redundant enable signal, and convert the semiconductor apparatus into a same operation state as an initialization state of the repair information in response to activation of the repair initialization signal; and a refresh counter configured to count the refresh addresses which are extended to a signal bit in response to the redundant count enable signal.

In an embodiment, a refresh method of a semiconductor apparatus may include: determining by a refresh control unit whether to set an additional refresh mode; converting by the refresh control unit the semiconductor apparatus into a same operation state as an initialization state of repair information which defines an address corresponding to a normal word line repaired by a redundant word line, when a refresh command is inputted in a state in which the additional refresh mode is set; and counting by a refresh counter refresh addresses which are extended to a signal bit corresponding to a redundant address corresponding to the redundant word line.

In an embodiment of the present disclosure, the addition refresh mode may include an operation mode for performing an additional refresh operation within a predetermined period in response to the refresh command.

In an embodiment of the present disclosure, the refresh method may further include recovering signal bits of the refresh addresses to signal bits corresponding to normal word lines and counting the signal bits, when a refresh operation according to the refresh command is ended.

In an embodiment of the present disclosure, the counting of the refresh addresses which are extended may include performing the refresh operation by simultaneously activating a plurality of word lines in each predetermined unit region for entire memory blocks of the semiconductor apparatus.

In an embodiment, a system comprises: a processor; a controller configured to receive a request and a data from the processor; and a memory unit configured to receive the request and the data from the controller, wherein the memory unit includes: a repair address processing unit configured to compare refresh addresses and repair information, activate a redundant enable signal, and convert the semiconductor into a same operation state as an initialization state of the repair information in response to an activation of a repair initialization signal; a refresh counter configured to count the refresh addresses extended to a signal bit in response to activation of a redundant count enable signal; and a refresh control unit configured to activate the repair initialization signal and the redundant count enable signal when an additional refresh mode is set in response to a refresh command.

BRIEF DESCRIPTION OF THE DRAWINGS

Features, aspects, and embodiments are described in conjunction with the attached drawings, in which.

DETAILED DESCRIPTION

Hereinafter, a refresh control circuit of a semiconductor apparatus and a refresh method using the same will be described below with reference to the accompanying drawings through various embodiments.

A semiconductor apparatus in accordance with an embodiment includes a normal word line corresponding to a failed memory cell and a redundant word line for replacing the normal word line. The failed normal word line may be replaced with the redundant word line.

An operation of replacing the failed normal word line with the redundant word line may be referred to as repair.

The semiconductor apparatus in accordance with an embodiment may be configured to initialize repair information; and perform refresh of the redundant word line as a refresh counter counts refresh addresses of not only the normal word line but also the redundant word line, in a specified refresh mode, for example, an additional refresh mode.

The additional refresh mode is an operation mode in which an additional refresh operation may be performed for a predetermined period, in response to an external or internal refresh command, that is, an auto refresh command or a self refresh command.

The additional refresh mode may be referred to as a hidden refresh mode.

Repair information may include addresses corresponding to normal word lines which are repaired by redundant word lines.

Figure 1:
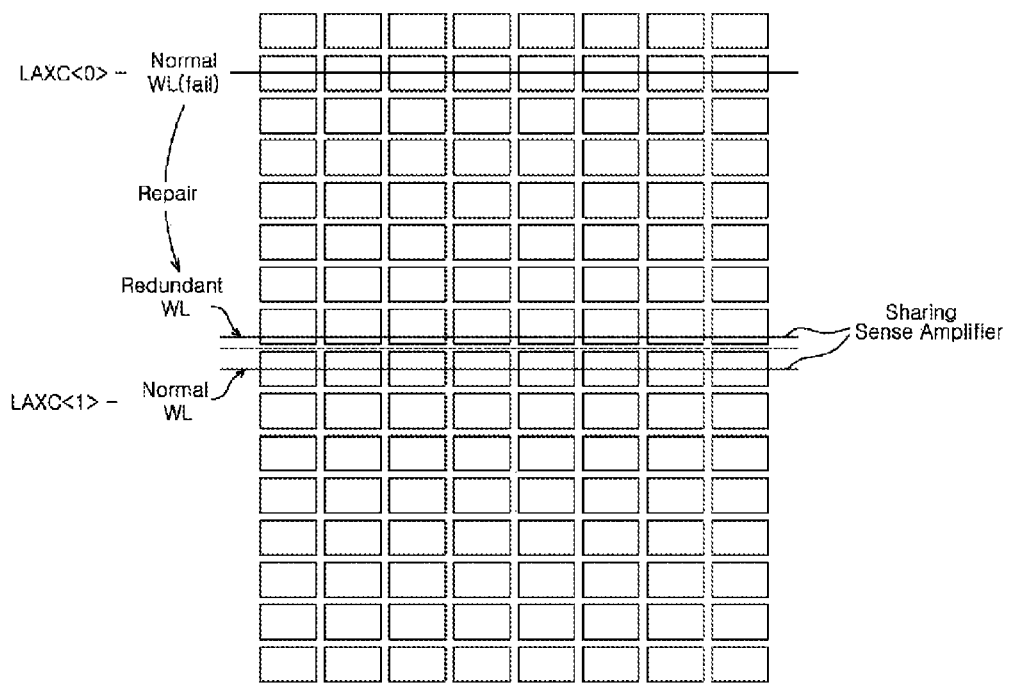
FIG. 1 is a layout diagram explaining a refresh operation error in the conventional art.
Figure 2:
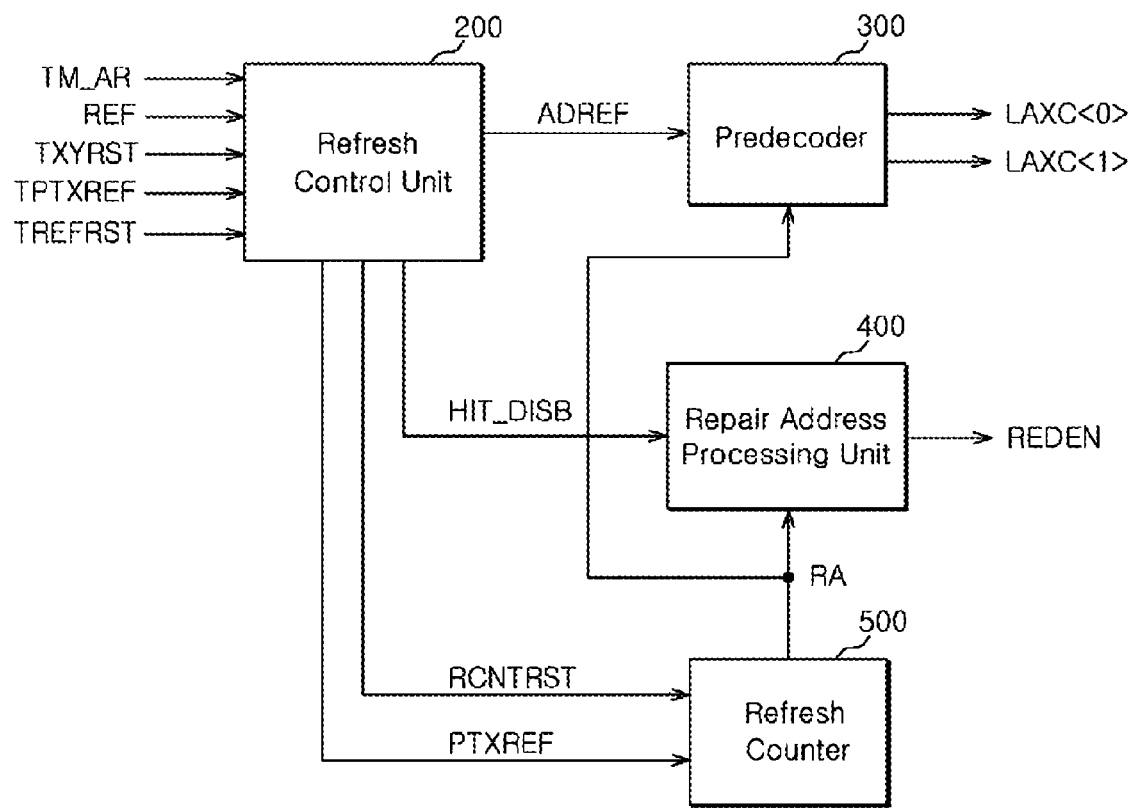
FIG. 2 is a block diagram showing a refresh control circuit of a semiconductor apparatus in accordance with an embodiment.

As shown in FIG. 2, a refresh control circuit 100 of a semiconductor apparatus in accordance with an embodiment may include a refresh control unit 200, a predecoder 300, a repair address processing unit 400, and a refresh counter 500.

The refresh control unit 200 may be configured to determine an additional refresh mode, convert the semiconductor apparatus into the same operation state as the initialization state of repair information when a refresh command is inputted in a state in which the additional refresh mode is set, and enable the refresh counter 500 to additionally count an address corresponding to a redundant word line.

The refresh control unit 200 may be configured to generate an additional refresh signal ADREF, a repair initialization signal HIT_DISB, a redundant count enable signal PTXREF and a count reset signal RCNTRST in response to an additional refresh mode setting signal TM_AR and a refresh signal REF.

The additional refresh mode setting signal TM_AR may set whether or not to use the additional refresh mode, by using the internal fuse set of the semiconductor apparatus. The additional refresh mode setting signal TM_AR may be a signal for setting an operation mode which enables an additional refresh operation to be performed within a predetermined period in response to a refresh command.

When the additional refresh mode is set to be used, the additional refresh mode setting signal TM_AR may be activated to a high level according to setting of the internal fuse set. The refresh control circuit 100 may be configured to perform a refresh operation by simultaneously activating a plurality of word lines in each predetermined unit region for entire memory blocks of the semiconductor apparatus when the additional refresh mode is set.

The refresh signal REF may be activated to a high level according to a refresh command, that is, an auto refresh command or/and a self refresh command.

The refresh control unit 200 may be configured to generate the additional refresh signal ADREF, the repair initialization signal HIT_DISB, the redundant count enable signal PTXREF and the count reset signal RCNTRST in response to the additional refresh mode setting signal TM_AR, the refresh signal REF, a first test signal TXYRST and a second test signal TPTXREF.

The refresh control unit 200 may be configured to activate the repair initialization signal HIT_DISB and the redundant count enable signal PTXREF in response to the first test signal TXYRST and the second test signal TPTXREF regardless of the additional refresh mode setting signal TM_AR and the refresh signal REF; and when an additional refresh mode for performing an additional refresh operation within a predetermined period is set in response to a refresh command.

The refresh control unit 200 may be configured to generate the count reset signal RCNTRST in response to a third test signal TREFRST.

The first test signal TXYRST is a signal for converting the semiconductor apparatus into the same operation state as the initialization state of the repair information, in a test process, for example, a probe test process.

The second test signal TPTXREF is a signal for enabling the refresh counter 500 to count a redundant address corresponding to a redundant word line, in the probe test process. The second test signal TPTXREF may be a signal for enabling the refresh counter 500 to count the refresh addresses RA which are extended to the signal bit corresponding to the redundant address in the test mode.

In a test process, not only a normal cell but also a redundant cell should be tested. Therefore, the semiconductor apparatus may be converted into the same operation state as the initialization state of the repair information by using the first test signal TXYRST; and the refresh counter 500 may count even the redundant address corresponding to the redundant word line by using the second test signal TPTXREF.

The predecoder 300 may be configured to generate word line control signals LAXC<0:1> in response to the additional refresh signal ADREF and refresh addresses RA.

The predecoder 300 may be configured to activate all the word line control signals LAXC<0:1> by using the refresh addresses RA when the additional refresh signal ADREF is activated, such that a plurality of word lines may be simultaneously selected.

The repair address processing unit 400 may be configured to generate a redundant enable signal REDEN in response to the repair initialization signal HIT_DISB and the refresh addresses RA.

The repair address processing unit 400 may be configured to compare the refresh addresses RA and the repair information; and activate the redundant enable signal REDEN when the refresh address RA is the address included in the repair information.

As the redundant enable signal REDEN is activated, a word line corresponding to a redundant address in place of a corresponding refresh address RA is activated.

The repair information is information on normal addresses in which fails are detected in a test process and which are thus repaired by redundant addresses.

The redundant addresses are addresses for repairing the normal addresses.

The repair address processing unit 400 may be configured to convert the semiconductor apparatus into the same operation state as the initialization state of the repair information in response to the repair initialization signal HIT_DISB.

The repair address processing unit 400 may retain the redundant enable signal REDEN in a deactivated state regardless of whether or not the refresh address RA is repaired when the repair initialization signal HIT_DISB is activated; and may thereby convert the semiconductor apparatus into the same operation state as the initialization state of the repair information.

The refresh counter 500 may be configured to count the refresh addresses RA in response to the redundant count enable signal PTXREF and the count reset signal RCNTRST.

The refresh counter 500 may be configured to extend the signal bits of count addresses to a signal bit corresponding to a redundant address, in response to the redundant count enable signal PTXREF, and output the refresh addresses RA. The refresh addresses RA may be extend to a signal bit corresponding to a redundant address and a redundant word line in response to the redundant count enable signal PTXREF.

The refresh counter 500 may be configured to extend the signal bits of count addresses to the signal bit corresponding to the redundant address when the redundant count enable signal PTXREF is activated, and output the refresh addresses RA.

For example, it is assumed that addresses allocated to normal word lines are A<0:12> and a redundant address allocated to a redundant word line is A<13>.

The refresh counter 500 counts the addresses A<0:13> by sequentially increasing the values thereof.

In the case where the redundant count enable signal PTXREF is deactivated, the address A<13> may be neglected, and the counted values of the addresses A<0:12> may be outputted as the refresh addresses RA.

The refresh counter 500 may output the counted values of the addresses A<0:13> as the refresh addresses RA in the case where the redundant count enable signal PTXREF is activated.

The refresh counter 500 may be configured to initialize the refresh addresses RA in response to the count reset signal RCNTRST.

Figure 3:
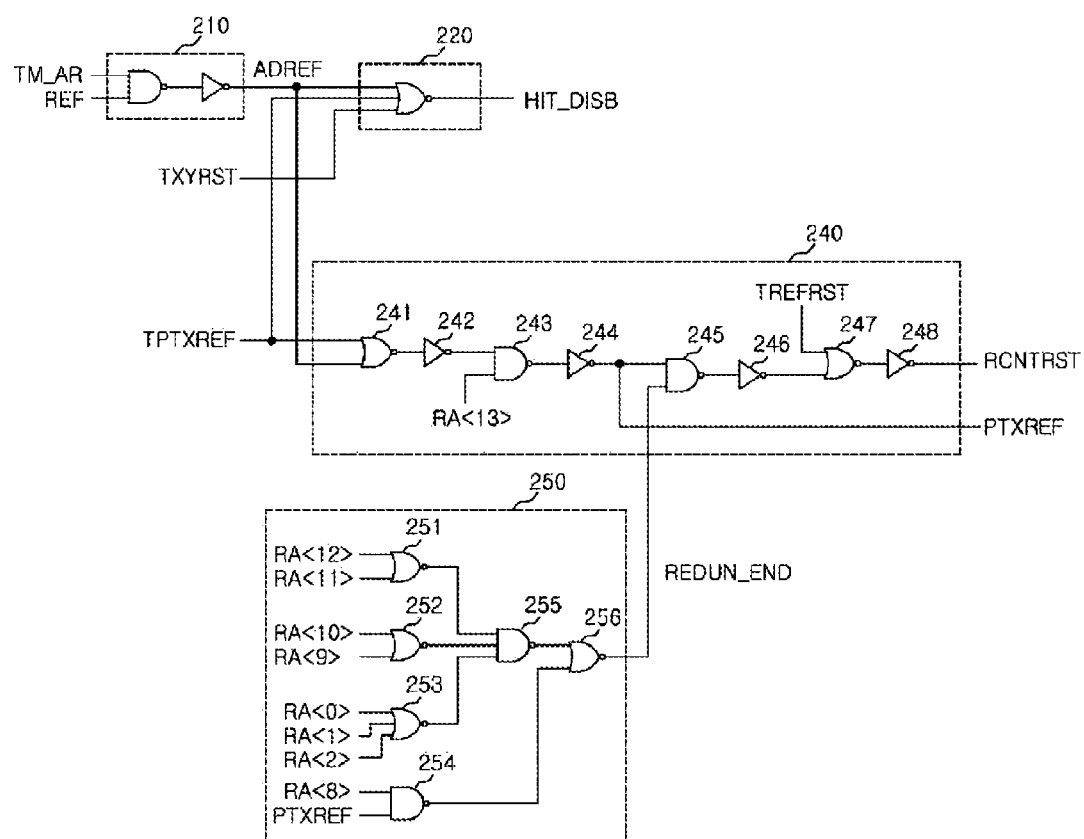
FIG. 3 is a circuit diagram of the refresh control unit of FIG. 2.

As shown in FIG. 3, the refresh control unit 200 includes a refresh mode determination block 210, a repair initialization block 220, a counter control block 240, and a redundant refresh end determination block 250.

The refresh mode determination block 210 may be configured to generate the additional refresh signal ADREF in response to the additional refresh mode setting signal TM_AR and the refresh signal REF.

The refresh mode determination block 210 may be configured to generate the additional refresh signal ADREF by ANDing the additional refresh mode setting signal TM_AR and the refresh signal REF.

The repair initialization block 220 may be configured to generate and activate the repair initialization signal HIT_DISB when even any one of the additional refresh signal ADREF, the first test signal TXYRST and the second test signal TPTXREF is activated.

The counter control block 240 may be configured to generate the redundant count enable signal PTXREF and the count reset signal RCNTRST in response to a refresh address RA<13>, a redundant refresh end signal REDUN_END, the second test signal TPTXREF and the additional refresh signal ADREF.

The counter control block 240 may be configured to activate the redundant count enable signal PTXREF when even any one of the second test signal TPTXREF and the additional refresh signal ADREF is activated and the refresh address RA<13> has the value of '1'.

The counter control block 240 may be configured to activate the count reset signal RCNTRST when the redundant count enable signal PTXREF and the redundant refresh end signal REDUN_END are activated.

The counter control block 240 may be configured to activate the count reset signal RCNTRST regardless of the redundant count enable signal PTXREF and the redundant refresh end signal REDUN_END when the third test signal TREFRST is activated.

The counter control block 240 may include a plurality of logic gates 241 to 248.

The redundant refresh end determination block 250 may be configured to generate the redundant refresh end signal REDUN_END in response to signal bits RA<12, 11, 10, 9, 0, 1, 2, 8> of the refresh addresses RA and the redundant count enable signal PTXREF.

The redundant refresh end determination block 250 may be configured to activate the redundant refresh end signal REDUN_END when the signal bits RA<12, 11, 10, 9, 0, 1, 2, 8> of the refresh addresses RA have preset values and the redundant count enable signal PTXREF is activated.

The redundant refresh end determination block 250 may be configured to activate the redundant refresh end signal REDUN_END when the signal bits RA<12, 11, 10, 9, 0, 1, 2, 8> are logic low and the signal bit RA<8> is logic high and the redundant count enable signal PTXREF is activated.

The refresh addresses RA when the signal bits RA<12, 11, 10, 9, 0, 1, 2, 8> are logic low and the signal bit RA<8> is logic high mean addresses for refreshing a final redundant word line. For this reason, the redundant refresh end signal REDUN_END is activated.

The redundant refresh end determination block 250 may include a plurality of logic gates 251 to 256.

Figure 4:
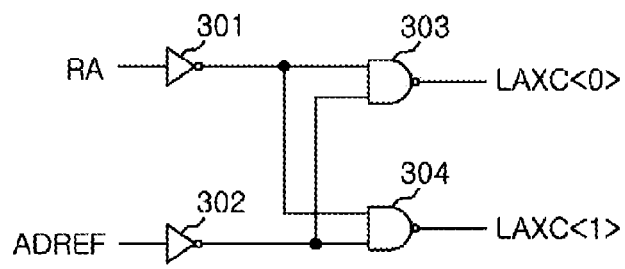
FIG. 4 is a circuit diagram of the predecoder of FIG. 2.

As shown in FIG. 4, the predecoder 300 may include first to fourth logic gates 301 to 304.

The first logic gate 301 is configured to receive and invert the refresh addresses RA.

The second logic gate 302 is configured to receive and invert the additional refresh signal ADREF.

The third logic gate 303 is configured to NAND the output of the first logic gate 301 and the output of the second logic gate 302 and generate the word line control signal LAXC<0>.

The fourth logic gate 304 is configured to NAND the output of the first logic gate 301 and the output of the second logic gate 302 and generate the word line control signal LAXC<1>.

Figure 5:
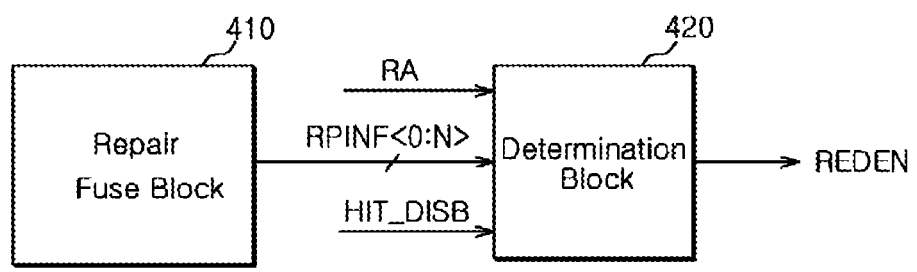
FIG. 5 is a block diagram showing the configuration of the repair address processing unit of FIG. 2.

As shown in FIG. 5, the repair address processing unit 400 may include a repair fuse block 410 and a determination block 420.

The repair fuse block 410 may be configured to store repair information RPINF<0:N>.

The repair information RPINF<0:N> is information on normal addresses which are repaired by redundant addresses as fails are detected in a test process.

The repair fuse block 410 may include a plurality of fuse sets, and may be configured to store addresses corresponding to the repair information RPINF<0:N>, in the plurality of fuse sets.

The determination block 420 may be configured to activate the redundant enable signal REDEN when the refresh address RA is the address included in the repair information RPINF<0:N>.

The determination block 420 may retain the redundant enable signal REDEN in the deactivated state regardless of whether or not the refresh address RA is repaired and regardless of the repair information RPINF<0:N>, when the repair initialization signal HIT_DISB is activated; and may thereby convert the semiconductor apparatus into the same operation state as the initialization state of the repair information.

The refresh operation of the semiconductor apparatus in accordance with an embodiment, configured as mentioned above, will be described below.

It is assumed that the additional refresh mode setting signal TM_AR is activated to the high level.

The additional refresh mode may be internally set to be performed for any one or both of an auto refresh operation period and a self refresh operation period.

In an auto refresh operation or a self refresh operation, the refresh signal REF is activated to the high level.

As the additional refresh mode setting signal TM_AR and the refresh signal REF are activated, the refresh control unit 200 activates the additional refresh signal ADREF, the repair initialization signal HIT_DISB and the redundant count enable signal PTXREF.

As the redundant count enable signal PTXREF is activated, the refresh counter 500 sequentially counts signal bits down to the signal bit allocated to the redundant address and outputs the refresh addresses RA.

As the repair initialization signal HIT_DISB is activated, the repair address processing unit 400 retains the redundant enable signal REDEN in the deactivated state; and converts the semiconductor apparatus into the same operation state as the initialization state of the repair information.

As the additional refresh signal ADREF is activated, the predecoder 300 generates the word line control signals LAXC<0:1> using the refresh addresses RA.

Since the redundant enable signal REDEN is in the deactivated state, the word lines corresponding to the word line control signals LAXC<0:1> are selected regardless of whether they are repaired or not, and the refresh operation is performed.

As the counting by the refresh counter 500 is performed, the refresh addresses RA reach maximum values (for example, all the addresses A<0:13> become '1'). In other words, the refresh addresses RA reach the final redundant address.

If the refresh addresses RA reach the maximum values, the refresh control unit 200 detects the corresponding state and activates the count reset signal RCNTRST.

As the reset signal RCNTRST is activated, the refresh addresses RA of the refresh counter 500 are converted into initial values.

In a test mode such as a probe test, by activating the first test signal TXYRST and the second test signal TPTXREF, the repair initialization signal HIT_DISB and the redundant count enable signal PTXREF may be activated regardless of the additional refresh mode setting signal TM_AR and the refresh signal REF.

Accordingly, in the state in which the semiconductor apparatus is converted into the same operation state as the initialization state of the repair information, a refresh operation test may be performed by selecting not only normal word lines but also redundant word lines.

Thereafter, as the auto refresh or self refresh operation is ended, the refresh signal REF is deactivated to a low level.

As the refresh signal REF is deactivated to the low level, the additional refresh signal ADREF, the repair initialization signal HIT_DISB and the redundant count enable signal PTXREF are deactivated.

As the redundant count enable signal PTXREF is deactivated, the refresh counter 500 may recover the signal bits of the refresh addresses RA to the signal bits corresponding to normal word lines, that is, the addresses A<0:12>, sequentially count the signal bits, and output the refresh addresses RA. The refresh counter 500 may be configured to perform these operations when a refresh operation according to the refresh command has ended.

As the repair initialization signal HIT_DISB is deactivated, the repair address processing unit 400 compares the repair information RPINF<0:N> and the refresh addresses RA and generates the redundant enable signal REDEN.

If the redundant enable signal REDEN is activated, instead of a normal word line corresponding to an occurred fail, a redundant word line replacing it is selected, and the refresh operation is performed.

Figure 6:
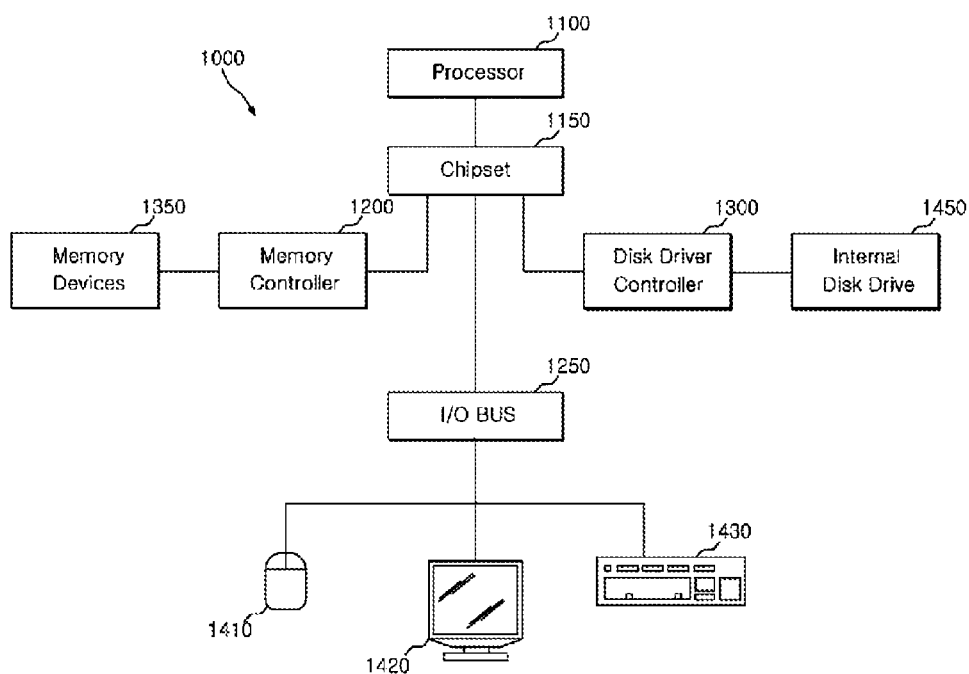
FIG. 6 illustrates a block diagram of a system employing a memory controller circuit in accordance with an embodiment.

Referring to FIG. 6, a system 1000 may include one or more processors 1100. The processor 1100 may be used individually in combination with other processors. A chipset 1150 may be electrically coupled to the processor 1100. The chipset 1150 is a communication pathway for signals between the processor 1100 and other components of the system 1000. Other components of the system 1000 may include a memory controller 1200, an input/output ("I/O") bus 1250 and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory device 1350 may include the semiconductor apparatus described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420 or a keyboard 1430. The I/O bus 1250 may employ any one of a number of communications protocols to communicate with the I/O devices 1410, 1420 and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drive 1450 may communicate with each other or with the chipset 1150 using virtually any type of communication protocol as discussed with regard to the I/O bus 1250.

As is apparent from the above descriptions, according to the embodiments, it is possible to improve repair efficiency and ensure a stable refresh operation.

While certain embodiments have been described above, it will be understood to those skilled in the art that the embodiments described are by way of example only. Accordingly, the refresh control circuit of a semiconductor apparatus and the refresh method using the same described herein should not be limited based on the described embodiments. Rather, the refresh control circuit of a semiconductor apparatus and the refresh method using the same described herein should only be limited in light of the claims that follow when taken in conjunction with the above description and accompanying drawings.

What is claimed is:
1. A refresh control circuit of a semiconductor apparatus, comprising:
  a repair address processing unit configured to compare refresh addresses and repair information, activate a redundant enable signal, and retain the redundant enable signal in a deactivated state regardless of a comparison result of the refresh addresses and the repair information in response to activation of a repair initialization signal;

a refresh counter configured to count the refresh addresses extended to a signal bit corresponding to redundant addresses by sequentially increasing a value thereof in response to activation of a redundant count enable signal; and a refresh control unit configured to activate the repair initialization signal and the redundant count enable signal when an additional refresh mode is set in response to a refresh command.

2. The refresh control circuit according to claim 1, wherein the refresh control circuit is configured to perform a refresh operation by simultaneously activating a plurality of word lines in each predetermined unit region for entire memory blocks when the additional refresh mode is set.

3. The refresh control circuit according to claim 2, further comprising:

a decoder configured to select the plurality of word lines in response to the refresh addresses.

4. The refresh control circuit according to claim 1, wherein the repair address processing unit comprises:

a repair fuse block configured to store the repair information which includes information on normal addresses repaired by the redundant addresses; and a determination block configured to activate the redundant enable signal when a refresh address is an address included in the repair information, and retain the redundant enable signal in a deactivated state when the repair initialization signal is activated.

5. The refresh control circuit according to claim 1, wherein the refresh counter is configured to recover signal bits of the refresh addresses to signal bits corresponding to normal word lines when the redundant count enable signal is deactivated, sequentially count the signal bits, and output the refresh addresses.

6. The refresh control circuit according to claim 1, wherein the refresh control unit is configured to activate the repair initialization signal and the redundant count enable signal according to a test mode setting.

7. A refresh control circuit of a semiconductor apparatus, comprising:

a refresh control unit configured to generate an additional refresh signal, a repair initialization signal and a redundant count enable signal in response to an additional refresh mode setting signal and a refresh signal;

a repair address processing unit configured to compare refresh addresses and repair information, activate a redundant enable signal, and retain the redundant enable signal in a deactivated state regardless of a comparison result of the refresh addresses and the repair information in response to activation of the repair initialization signal; and a refresh counter configured to count the refresh addresses extended to a signal bit corresponding to redundant addresses by sequentially increasing a value thereof in response to the redundant count enable signal.

8. The refresh control circuit according to claim 7, further comprising:

a decoder configured to select a plurality of word lines in response to the additional refresh signal and the refresh addresses.

9. The refresh control circuit according to claim 7, wherein the refresh signal is generated according to a refresh command.

10. The refresh control circuit according to claim 9, wherein the additional refresh mode setting signal is configured to set an operation mode which enables an additional refresh operation to be performed within a predetermined period in response to the refresh command.

11. The refresh control circuit according to claim 7, wherein the refresh control unit is configured to activate the repair initialization signal and the redundant count enable signal in response to a first test signal and a second test signal.

12. The refresh control circuit according to claim 11, wherein the first test signal is configured to convert the semiconductor apparatus into the same operation state as the initialization state of the repair information in a test mode.

13. The refresh control circuit according to claim 11, wherein the second test signal is configured to enable the refresh counter to count the refresh addresses which are extended to the signal bit corresponding to a redundant address, in the test mode.

14. The refresh control circuit according to claim 7, wherein the refresh control unit comprises:

a refresh mode determination block configured to generate the additional refresh signal in response to the additional refresh mode setting signal and the refresh signal;

a repair initialization block configured to generate the repair initialization signal in response to the additional refresh signal;

a counter control block configured to generate the redundant count enable signal and a count reset signal in response to the signal bit of the refresh addresses, a redundant refresh end signal and the additional refresh signal; and a redundant refresh end determination block configured to generate the redundant refresh end signal in response to signal bits of the refresh addresses and the redundant count enable signal.

15. The refresh control circuit according to claim 7, wherein the repair address processing unit comprises:

a repair fuse block configured to store the repair information which includes information on normal addresses repaired by the redundant addresses; and a determination block configured to activate the redundant enable signal when a refresh address is included in the repair information, and retain the redundant enable signal in a deactivated state when the repair initialization signal is activated.

16. The refresh control circuit according to claim 7, wherein the refresh counter is configured to recover signal bits of the refresh addresses to signal bits corresponding to normal word lines when the redundant count enable signal is deactivated, sequentially count the signal bits, and output the refresh addresses.

17. A refresh method of a semiconductor apparatus, comprising:

determining by a refresh control unit whether to set an additional refresh mode;

deactivating a redundant enable signal for activating a redundant word line regardless of a comparison result of refresh addresses and repair information which defines an address corresponding to a normal word line repaired by a redundant word line when a refresh command is inputted in a state in which the additional refresh mode is set; and counting by a refresh counter refresh addresses which are extended to a signal bit corresponding to a redundant address corresponding to the redundant word line.

18. The refresh method according to claim 17, wherein the additional refresh mode is an operation mode for performing an additional refresh operation within a predetermined period in response to the refresh command.

19. The refresh method according to claim 17, further comprising:
   recovering signal bits of the refresh addresses to signal bits corresponding to normal word lines and counting the signal bits when a refresh operation according to the refresh command is ended.

20. The refresh method according to claim 17, wherein the counting of the refresh addresses which are extended comprises:
   performing the refresh operation by simultaneously activating a plurality of word lines in each predetermined unit region for entire memory blocks.

* * * * *